United States Patent
Yang et al.

(10) Patent No.: US 12,213,287 B2
(45) Date of Patent: Jan. 28, 2025

(54) HEAT SINK FOR A SOLID-STATE CIRCUIT BREAKER IN AN ELECTRICAL PANEL

(71) Applicant: Siemens Industry, Inc., Alpharetta, GA (US)

(72) Inventors: Guang Yang, Johns Creek, GA (US); James Edward Ferree, Lawrenceville, GA (US); Solomon R. R. Titus, Cumming, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 295 days.

(21) Appl. No.: 17/822,274

(22) Filed: Aug. 25, 2022

(65) Prior Publication Data

US 2024/0074112 A1 Feb. 29, 2024

(51) Int. Cl.
*H05K 7/20* (2006.01)
*H01H 9/52* (2006.01)
*H02B 1/56* (2006.01)

(52) U.S. Cl.
CPC ........... *H05K 7/20409* (2013.01); *H01H 9/52* (2013.01); *H02B 1/56* (2013.01)

(58) Field of Classification Search
CPC . H02B 1/56–565; H01H 9/52; H05K 7/20409
See application file for complete search history.

(56) References Cited

U.S. PATENT DOCUMENTS

| | | | | |
|---|---|---|---|---|
| 5,283,542 A * | 2/1994 | Ochiai | ...... | C08K 3/28 |
| | | | | 525/437 |
| 9,245,699 B2 * | 1/2016 | Horowy | ...... | H01H 9/52 |
| 9,287,065 B1 * | 3/2016 | Davis | ...... | H02B 1/056 |
| 11,158,477 B2 * | 10/2021 | Mazur | ...... | H01H 83/10 |
| 11,322,916 B2 | 5/2022 | Miller et al. | | |
| 11,342,151 B2 * | 5/2022 | Telefus | ...... | H02M 7/217 |
| 11,652,091 B2 * | 5/2023 | Salvatore | ...... | H02H 3/02 |
| | | | | 361/115 |
| 11,699,562 B2 * | 7/2023 | Mazur | ...... | H01H 71/1081 |
| | | | | 361/115 |
| 2016/0042898 A1 * | 2/2016 | Watford | ...... | H01H 71/16 |
| | | | | 337/112 |
| 2020/0365356 A1 * | 11/2020 | Telefus | ...... | H02H 3/08 |
| 2020/0395739 A1 | 12/2020 | Santore et al. | | |
| 2021/0265124 A1 * | 8/2021 | Mazur | ...... | H01H 71/1081 |
| 2022/0037230 A1 | 2/2022 | Yang | | |

FOREIGN PATENT DOCUMENTS

| | | | | |
|---|---|---|---|---|
| CN | 214099522 U | * | 8/2021 | |
| CN | 214848401 U | * | 11/2021 | |
| EP | 2624274 A1 | | 8/2013 | |
| WO | WO-2024049836 A2 | * | 3/2024 | ............. H01H 73/22 |

* cited by examiner

*Primary Examiner* — Robert J Hoffberg

(57) ABSTRACT

A solid-state circuit breaker (SSCB) includes an airgap operating mechanism including components and electronics including semiconductors and software algorithms that control the power and can interrupt extreme currents. The SSCB further includes a housing that houses the components of the airgap operating mechanism and the electronics. The housing of the solid-state circuit breaker includes a heat sink that interfaces with a natural air flow such as an existing vertical air channel inside an electrical panel. The heat sink contains a thermally conductive and electrically insulating (TC/EI) plastic.

14 Claims, 14 Drawing Sheets

HEAT SINK FOR A SOLID-STATE CIRCUIT BREAKER IN AN ELECTRICAL PANEL

BACKGROUND

1. Field

Aspects of the present invention generally relate to a heat sink for a solid-state circuit breaker in an electrical panel such that the heat sink interfaces with and takes advantage of existing air currents inside the electrical panel.

2. Description of the Related Art

Solid-State Circuit Breakers (SSCBs) are an emerging technology. They are characterized by semiconductor switching components such as metal-oxide-semiconductor field-effect transistors (MOSFETs) that shut off the flow of electricity without the occurrence of an electric arc. They have major advantages that make them desirable as replacements for conventional circuit breakers. However, the semiconductor switching components in SSCBs generally produce more heat than conventional circuit breaker contacts. Because of this additional heat, SSCBs cannot directly replace conventional circuit breakers unless they are investigated, for example by testing, and found suitable for use in the specific electrical panels where it is desired to install them.

The problem is how to minimize the temperature rise of components in solid-state circuit breakers (SSCBs) in an electrical panel. A more specific problem is how to minimize temperature rise of SSCBs that are installed in existing-production electrical panels that were originally designed for conventional circuit breakers.

The electrical distribution industry is presently dominated by conventional circuit breakers that use mechanically separating contacts to interrupt the flow of current. As the contacts open, an electric arc temporarily conducts through air between the contacts, as the current is being switched off, under all conditions of switching off under load. The arc is inherent because, whenever current is flowing, there will be inductive energy stored in the overall circuit that must be dissipated when the flow of current stops. The arc is resistive and produces a reverse voltage that stops the flow of current.

Circuit breakers in general are devices that safely stop the flow of electrical current under various conditions: normal rated current, overload currents (from 135% to times rated current), and short circuit currents up to the marked interrupting capacity of the device. Conventional circuit breakers accomplish this. However, the electric arc erodes contacts, which limits the endurance life of the product. At normal rated current, switching life is typically limited to several thousand operations, for example up to 10,000 operations. At overload levels, switching life is reduced to fewer operations, for example up to 50 operations. At short circuit levels, a conventional circuit breaker will be able to interrupt even fewer times and then might need replacement. Furthermore, under overload and short circuit conditions, the current rises to levels much higher than rated current, which can stress downstream components.

By contrast, SSCB's experience no electric arc, and the current can be shut off within nanoseconds or milliseconds before it rises to a high level. Therefore, a SSCB can potentially switch many thousands or even millions of times. It can potentially provide superior protection to branch circuits by eliminating damaging let-through currents.

Clearly, the advantages of SSCBs would be a benefit to the public. However, the additional heat produced by SSCBs is a challenge that must be addressed.

Conventional circuit breakers have several sources of heat:

1. The internal conducting path. This includes for example the terminals, moving contact arm, and flexible connectors. Heat production is managed by proper sizing of the conductor cross-sections.
2. The mechanically-separable interface of the electrical contacts. The phenomenon of heat generation at current constrictions at the touching interface of electrical contacts is well-documented. Heat production is managed by material selection and sufficient spring force to press the contacts together.
3. The current sensing device. Some circuit breakers, known as "thermal/magnetic" circuit breakers, contain bimetals and resistive elements, in the current path, that intentionally generate heat to actuate automatic opening (a.k.a. "tripping"). Other circuit breakers sense current using electronic circuits with current transformers or resistive shunts. These are known as "electronic trip unit" (or ETU) breakers. ETU components produce some amount of heat, but not necessarily as much as thermal/magnetic breakers.

Conventional circuit breakers dissipate heat through two means:

1. Conduction into the wires or bus attached to the terminals.
2. Conduction, convection and radiation through the insulated housing to the surroundings.

If multiple circuit breakers are installed in an electrical panel, then the heat from the circuit breakers is transferred into the interior of the electrical panel. The interior of the electrical panel rises in temperature. Heat from inside the panel ultimately passes through the walls of the panel and dissipates to the environment via conduction, convection and radiation.

SSCBs have all the heat sources of conventional circuit breakers (mentioned above) and more. SSCBs are required to have mechanically-separating contacts in order to give sufficient electrical isolation by means of an air gap. These "air-gap" contacts do not experience arcing like conventional breakers; however, they necessarily produce heat while in the ON state, like a conventional breaker. Likewise, SSCBs have conducting paths and current-sensing devices. But in addition to this, they also have the following sources of heat:

1. The semiconductor switching components. These are generally transistor components such as FETs, MOSFETs, IGBTs, etc. Transistor components have an inherent resistance between the "drain" and the "source", known as $R_{ds}$. In the ON state, current I is flowing continuously through the drain and source. Therefore, power P is produced according to $P=I^2 R_{ds}$. Although semiconductor component manufacturers are constantly striving to reduce the value of $R_{ds}$, at the present time this is typically the largest source of heat in a SSCB.
2. Other electronic components. The SSCB may have other sources of heat such as a switching power supply, a logic processor, passive components, etc. These typically produce less heat than the power switching component.

Within North America for example, the temperature rise in circuit breakers and electrical panels is governed by strict temperature limits for safety in industry standards such as UL489 and UL67. Manufacturers must demonstrate via specified test procedures that circuit breakers installed in electrical panels meet these temperature limits. Furthermore, manufacturers must assure that electronic components do not exceed damaging temperature levels.

Within North America for example, there is a massive installed base of existing electrical panels and load centers that contain conventional circuit breakers. The most common branch circuits are protected by circuit breakers less than 100 A; especially common are 15 and 20 A circuit breakers. It is a common practice to add new circuit breakers to existing panels, for example when a building is remodeled and the electrical wiring is expanded. It would be advantageous to be allow the new circuits to be protected by SSCBs. It would further be advantageous to be able to upgrade existing installations by replacing conventional circuit breakers with SSCBs and thereby improve the circuit protection.

Furthermore, it would be advantageous for new installations to use existing production electrical panels with SSCBs, rather than requiring a new design of electrical panel. Electrical distribution is a mature industry with much factory investment in mass-produced products. Many thousands of electricians are trained how to install these products. There are many versions of circuit breakers and other accessories that are compatible with existing-production panels. It would be advantageous that a new SSCB product should be usable as an incremental improvement to an existing product line, rather than to require an entire new product line that is incompatible with earlier products.

It is also foreseen that it might be feasible to make incremental improvements of existing production electrical panels that would enhance heat transfer, to extend and increase the usability of SSCBs. In this case, it would be advantageous to keep maximum physical compatibility between the SSCBs, conventional breakers and panels. Also, it would be advantageous to maximize the use of parts already in production, such as parts comprising panels and associated accessories.

By way of example, let us consider a 20 A rated miniature circuit breaker (MCB) that is installed into an electrical panel. Such a circuit breaker is typically loaded to no more than 80% of its nominal rating, that is, 16 A. A typical value of heat generation for a conventional MCB at 16 A loading might be about 1.5 watts. On the other hand, a typical value of heating for a similarly rated and loaded SSCB might be about 5 watts. Clearly, the SSCB produces more heat. To prevent excessive temperature rise and to allow the maximum possible number of SSCBs in an electrical panel, it is desirable to minimize the temperature rise of the SSCB.

Therefore, it would be useful to provide a device or means to reduce the temperature rise of a SSCB in a manner that the SSCB is compatible with existing production panels, in which such panels are already available in the marketplace or are already installed.

Therefore, there is a need for a device or means to reduce the temperature rise of a solid-state circuit breaker (SSCB).

SUMMARY

Briefly described, aspects of the present invention relate to a heat sink for a solid-state circuit breaker. The field of the invention involves low-voltage circuit breakers, such as miniature circuit breakers (MCBs) or molded case circuit breakers (MCCBs) that have a housing of insulated plastic material and are installed into electrical panels. This invention provides improved dissipation of heat for SSCBs. It further provides improved dissipation of heat for SSCBs that are installed into existing-production electrical panels.

In accordance with one illustrative embodiment of the present invention, a solid-state circuit breaker (SSCB) comprises an airgap operating mechanism including components and electronics including semiconductors and software algorithms that control the power and can interrupt extreme currents. The SSCB further comprises a housing that houses the components of the airgap operating mechanism and the electronics. The housing of the solid-state circuit breaker includes a heat sink that interfaces with a natural air flow inside an electrical panel. The heat sink contains a thermally conductive and electrically insulating (TC/EI) plastic.

In accordance with one illustrative embodiment of the present invention, an electrical panel comprises an existing vertical air channel formed in a space in front of a main bus of the electrical panel. The electrical panel further comprises a plurality of solid-state circuit breakers (SSCBs) such that conventional breakers and the SSCBs can be mixed together in the electrical panel. The electrical panel further comprises a plurality of heat sinks such that each solid-state circuit breaker (SSCB) has its own integral heat sink. Each heat sink interfaces with the existing vertical air channel inside the electrical panel and the plurality of heat sinks are totally enclosed inside the electrical panel. Each solid-state circuit breaker comprises an airgap operating mechanism including components and electronics including semiconductors and software algorithms that control the power and can interrupt extreme currents. The SSCB further comprises a housing that houses the components of the airgap operating mechanism and the electronics. The housing of the solid-state circuit breaker includes a heat sink of the plurality of heat sinks. The heat sink comprises a thermally conductive and electrically insulating (TC/EI) plastic.

In accordance with one illustrative embodiment of the present invention, a method of reducing a temperature rise in a solid-state circuit breaker (SSCB) is described. The method comprises providing an airgap operating mechanism including components, providing electronics including semiconductors and software algorithms that control the power and can interrupt extreme currents and providing a housing that houses the components of the airgap operating mechanism and the electronics. The housing of the solid-state circuit breaker includes a heat sink that interfaces with an existing vertical air channel inside an electrical panel. The existing vertical air channel is formed in a space in front of a main bus of the electrical panel. The heat sink comprises a thermally conductive and electrically insulating (TC/EI) plastic.

The above described features and advantages, as well as others, will become more readily apparent to those of ordinary skill in the art by reference to the following detailed description and accompanying drawings. While it would be desirable to provide one or more of these or other advantageous features, the teachings disclosed herein extend to those embodiments which fall within the scope of the appended claims, regardless of whether they accomplish one or more of the above-mentioned advantages.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects.

DETAILED DESCRIPTION

Figure 1:
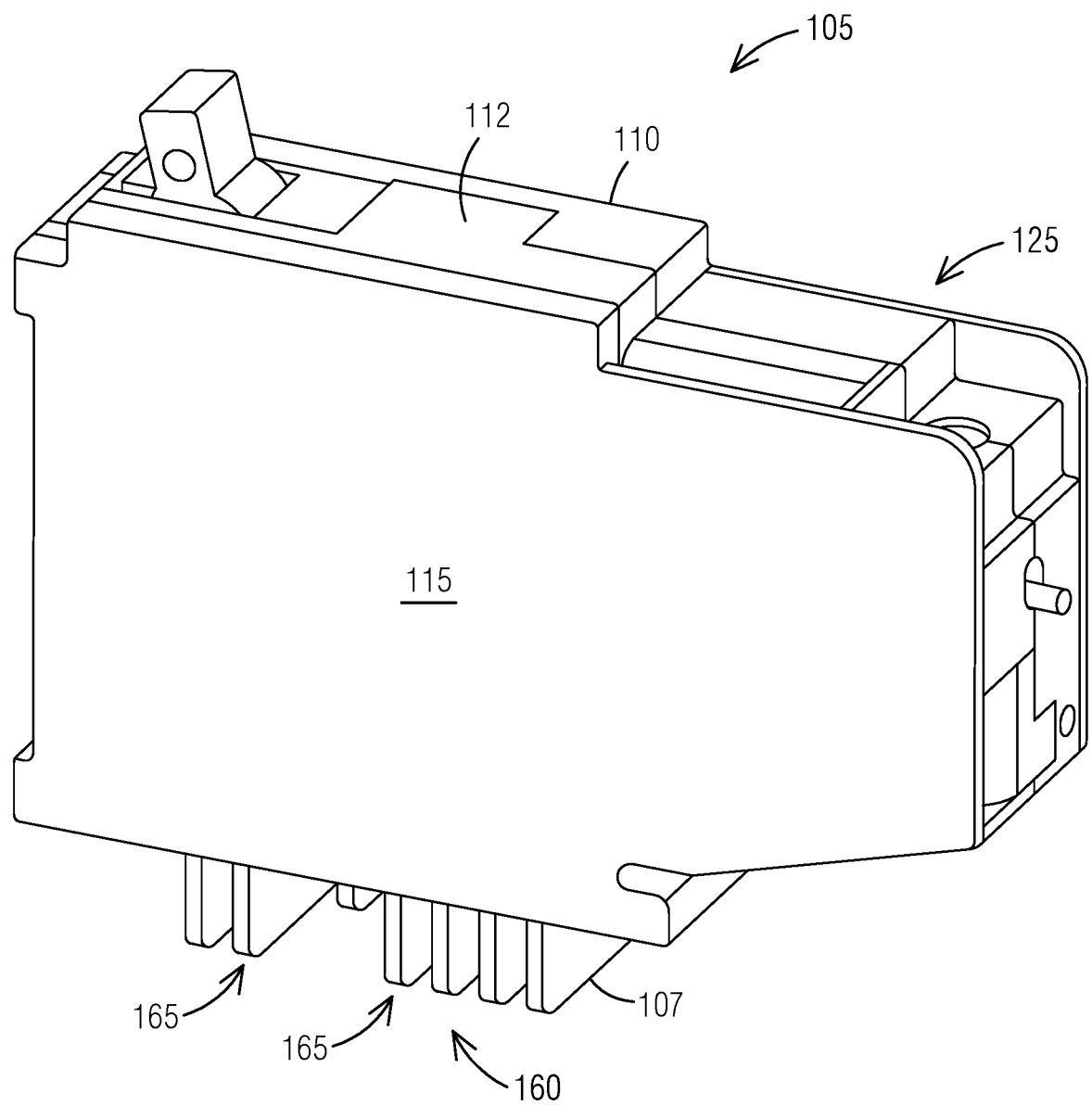
FIGS. 1-5 illustrate a solid-state circuit breaker with a heat sink in accordance with an exemplary embodiment of the present invention.

Various technologies that pertain to systems and methods that facilitate a heat sink for a solid-state circuit breaker will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

To facilitate an understanding of embodiments, principles, and features of the present invention, they are explained hereinafter with reference to implementation in illustrative embodiments. In particular, they are described in the context of a heat sink for a solid-state circuit breaker. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the heat sink for a solid-state circuit breaker according to the present disclosure are described below with reference to FIGS. 1-15 herein. Like reference numerals used in the drawings identify similar or identical elements throughout the several views. The drawings are not necessarily drawn to scale.

Consistent with one embodiment of the present invention, FIGS. 1-5 represent a solid-state circuit breaker (SSCB) 105 including a heat sink 107 for reducing a temperature rise in the solid-state circuit breaker 105 in accordance with an exemplary embodiment of the present invention. FIG. 1 illustrates the solid-state circuit breaker 105 with the heat sink 107 that interfaces with a natural air flow such as an existing vertical air channel (not seen) inside an electrical panel (not seen). The natural air flow is the case where a single solid-state circuit breaker 105 is housed in a small enclosure, with the heat sink 107 driving air currents inside the enclosure, but there is maybe not a discernable "air channel" like with multiple solid-state circuit breakers in a bigger electrical panel.

The heat sink 107 comprises a thermally conductive, electrically insulating (TC/EI) plastic. "Thermally conductive, electrically insulating (TC/EI)" materials often include additives like boron nitride. The boron nitride provides high thermal conductivity but allows the base resin to retain its electrically insulative properties. And extensive material testing confirms their superior thermally conductive and electrically isolating properties.

The heat sink 107 is comprised of a thermally conductive, but electrically insulating (TC/EI) plastic. The heat sink 107 comprises part of an outer molded case of the circuit breaker 105, therefore it must be electrically insulating for safety and to meet the requirements of UL489. Therefore, the heat sink 107 cannot be made from traditional heat sink materials such as aluminum or copper. Fortunately, there are relatively new plastic materials available with improved thermal conduction, but electrically insulating properties. The following chart illustrates the relative thermal conductivity of various materials:

TABLE I

| Material | Thermal conductivity k [W/(m° K)] |
| --- | --- |
| Common plastics | 0.1 to 0.5 |
| Thermally conductive, electrically insulating (TC/EI) plastics | 5 to 20 |
| Extruded aluminum | 205 |
| Copper | 400 |

It can be seen from Table I included above that TC/EI plastics have thermal conductivities ("k") an order of magnitude greater than common plastics, but much less than aluminum or copper. Such high k values are unnecessary, but much smaller values provide a significant benefit in reducing the temperature rise of the transistor components in the circuit breaker 105.

The TC/EI plastic heat sink 107 may be produced by partially over-molding a printed circuit board (PCB), so that the plastic covers the heat-producing transistor components. By over-molding, air spaces are eliminated so that heat is conducted from the transistor components to the heat sink 107 with a minimum of temperature rise. Alternatively, the heat sink 107 might be produced as a separate part that covers the transistor components. If produced as a separate part, then heat transfer might be enhanced with a thermally conductive interface material such as a grease, film or gasket. The TC/EI plastic heat sink 107 may also be attached without overmoulding.

In one embodiment, the solid-state circuit breaker (SSCB) 105 comprises a base 110, a main cover 112 and an outer cover 115. The solid-state circuit breaker (SSCB) 105 further comprises a traditional airgap operating mechanism (not seen) including components. The solid-state circuit breaker (SSCB) 105 further comprises electronics 120 (e.g., FETs 122, see FIG. 4) including semiconductors and software algorithms that control the power and can interrupt extreme currents.

The solid-state circuit breaker (SSCB) 105 further comprises a housing 125 (made of the base 110, the main cover 112 and the outer cover 115) that houses the components of the airgap operating mechanism and the electronics 120. The housing 125 of the solid-state circuit breaker (SSCB) 105 includes the heat sink 107.

Optionally, the solid-state circuit breaker (SSCB) 105 further comprises perforations 130 in the main cover 112. The perforations 130 allow an airflow but prevent insertion of objects that touch delicate or electrically live parts. The solid-state circuit breaker (SSCB) 105 further comprises a plurality of air vents 135 to provide an air flow to cool electronic components such as the electronics 120.

Figure 2:
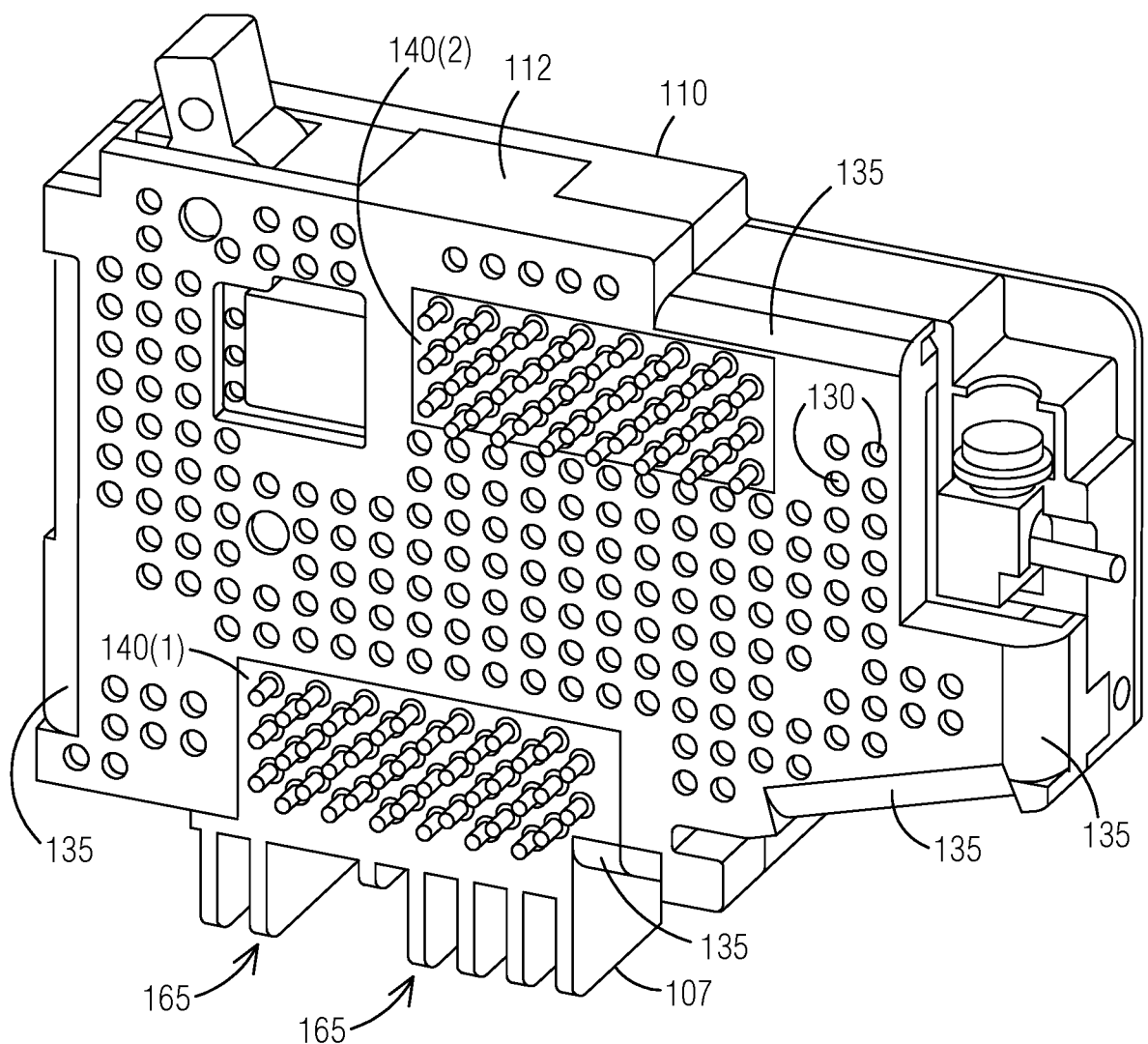

The solid-state circuit breaker (SSCB) 105 further comprises two over-molded plastic parts 140(1-2) such that the heat sink 107 is integral to a $1^{st}$ over-molded part 140(1) while a $2^{nd}$ over-molded part 140(2) is disposed at a distance from the $1^{st}$ over-molded part 140(1) as seen in FIG. 2 (the outer cover 115 is removed).

Figure 3:
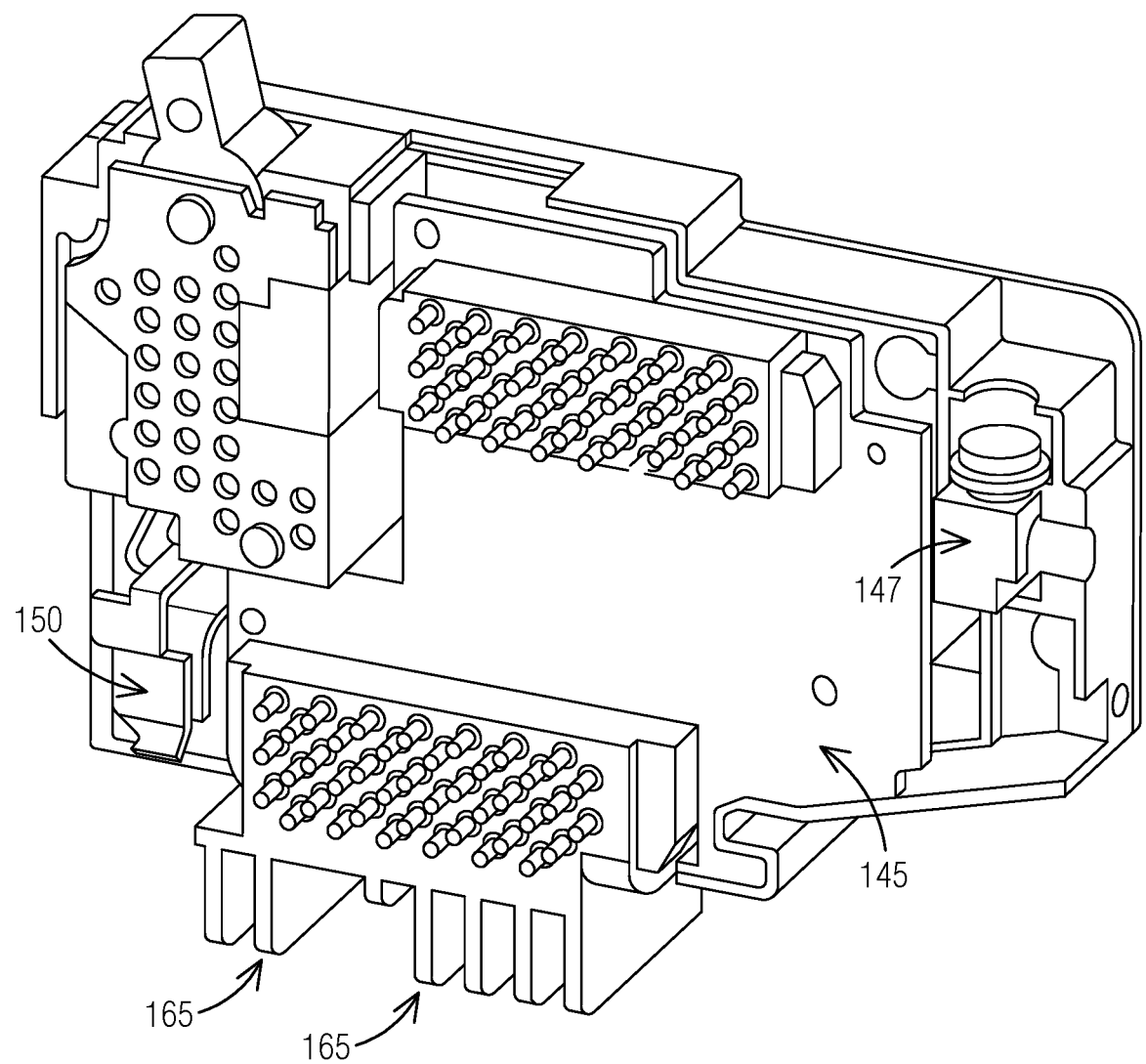
Figure 4:
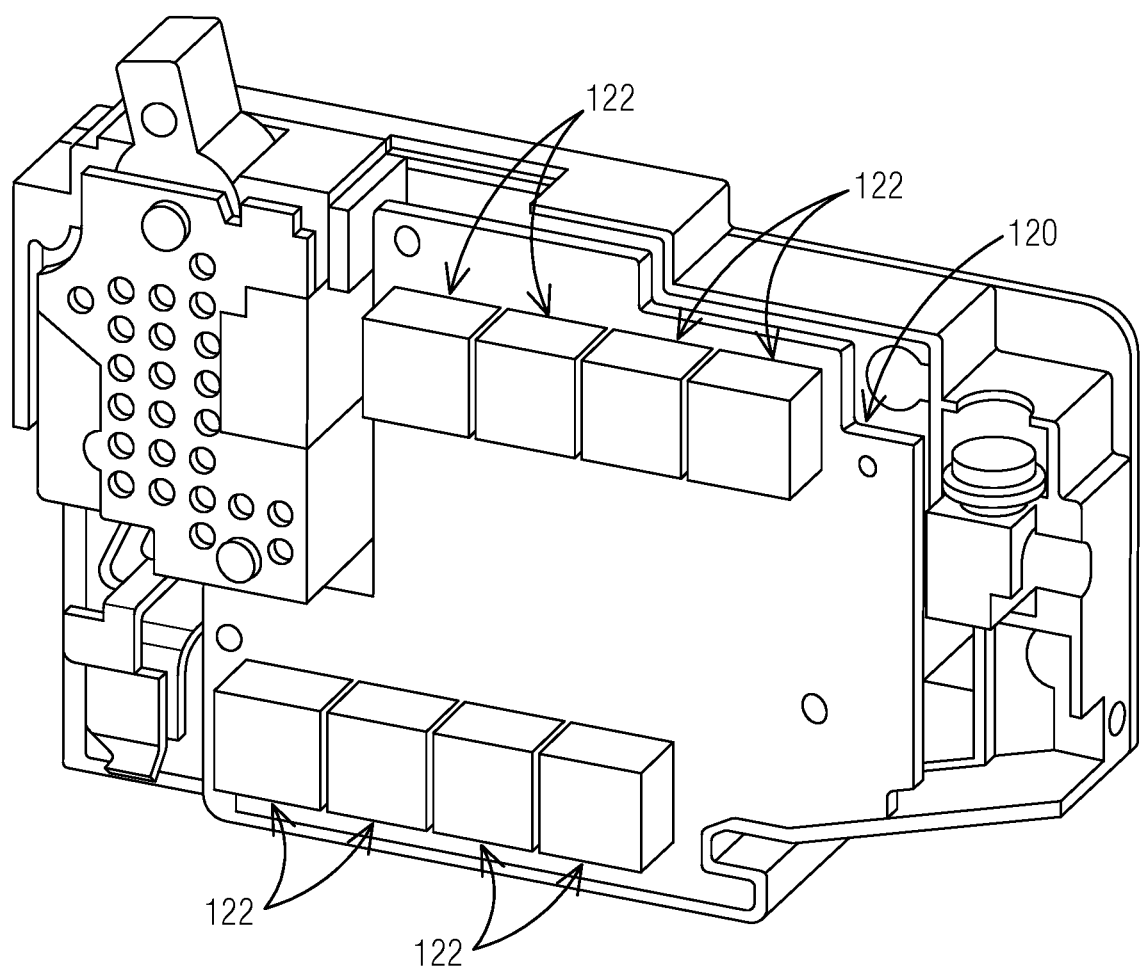
Figure 5:
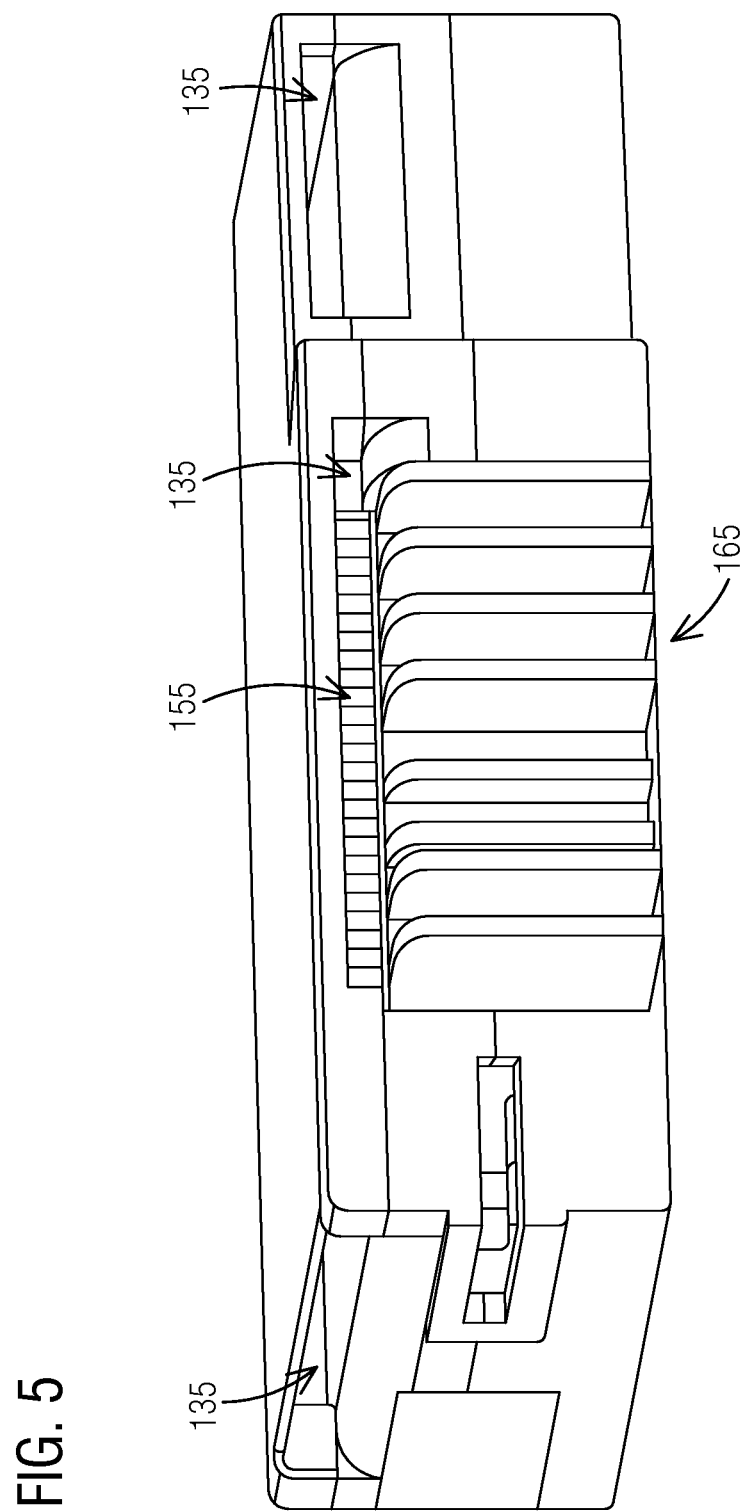

The solid-state circuit breaker (SSCB) 105 further comprises a printed circuit board 145, a terminal lug 147, a plug-in connection 150 (see FIG. 3). In FIG. 5, vent locations of the air vents 135 are shown. The venting feature as a rear vent is still present at a location 155 even with the added heat sink 107. One or more "ventilation openings" such as the air vents 135 in the solid-state circuit breaker 105 include a "rear vent" that it allows an air flow to exit the solid-state circuit breaker 105 into the existing vertical air channel. Optionally, the heat sink 107 may be present without air vents 135.

An example SSCB shown in FIG. 3 shows power transistor components in 2 groups of 4 Field Effect Transistors (FETs). One group of 4 FETs is conveniently located near an air channel. This group of FETs is over-molded with TC/EI plastic and has an integral finned heat sink extending into the air channel. But in addition, the second group of 4 FETs is also over-molded with a second piece of TC/EI plastic. A known connector or bridge means is provided to transfer heat from the second piece of TC/EI plastic to the first piece, and then to the external heat sink fins.

An example SSCB in FIGS. 2 and 3 has cylindrical posts extending from two over-molded plastic parts. These increase heat transfer by increasing a surface area. These posts allow for 2-dimensional airflow inside the circuit breaker 105. The posts could conceivably be non-cylindrical, however, cylinders are preferred for less resistance to flow, and they are easy to produce in a mold. The posts are an optional feature. They might be omitted if a stronger internal airflow is needed, or if they are unmoldable with the chosen plastic resin.

In addition to the heat sink 107, ventilation openings are provided in the circuit breaker 105. One of the openings, the "rear vent", allows air flow to exit the breaker 105 into an existing vertical air channel. One or more other ventilation openings are located on the exterior of the breaker housing at locations other than the existing vertical air channel. These "other vent openings" allow air to enter the circuit breaker 105. Airflow in the existing vertical air channel produces a "Bernoulli effect" that draws air through the breaker 105, which increases cooling of the breaker interior. See FIG. 14. The air enters through the "other vent openings" and exits through the "rear vent". The heated air entering the existing vertical air channel from the "rear vents" also adds to the chimney effect.

The chimney effect and air currents are entirely internal to the electrical panel. No ventilation holes are added to the electrical panel. The air currents help to spread the heat inside the electrical panel. The heat is transferred through the steel walls of the electrical panel by convection and conduction to the external environment. The air velocities are increased by the added heat from the SSCBs, which enhances heat transfer to the environment. But otherwise, there is no change in design of the electrical panel itself. The customer does not have to change the way the electrical panel is installed.

The heat sink 107 may be located at a back 160 (see FIG. 1) of the solid-state circuit breaker 105 and the heat sink 107 is configured to extend into the existing vertical air channel of the electrical panel.

The heat sink 107 is part of an outer molded case such that a plastic part such as the two over-molded plastic parts 140(1-2) of the heat sink 107 are over-molded onto the printed circuit board 145 so that the plastic part covers semiconductors of the solid-state circuit breaker 105. The plastic part is to be separated into two or more parts if the semiconductors are located at different locations on the printed circuit board 145 such that a thermal bridge (see description with respect to FIG. 2) to conduct heat between the two or more parts and eventually to a plurality of fins 165 external to the solid-state circuit breaker 105. The heat sink 107 includes the plurality of fins 165 on an exterior of the solid-state circuit breaker 105 and the plurality of fins 165 extends into the existing vertical air channel. The plurality of fins 165 are disposed in a space in the electrical panel behind the solid-state circuit breaker 105 that is otherwise empty.

The means of transferring heat between the two over-molded parts can be accomplished in multiple alternative ways. First, a bridge of copper or aluminum might connect the two over-molded plastic parts 140(1-2). Second, the main cover 112, for example as shown in FIG. 2, might also be molded from a TC/EI plastic, touching the two over-molded plastic parts 140(1-2), and serve as a thermal bridge. Third, instead of over-molding, the main cover 112 and the heat sink 107 might be a single integrated part, which presses against both groups of FETs. Fourth, the second molded part 140(2) might be omitted, by providing a sufficient thermal bridge in the PCB itself from copper layers in the PCB. Fifth, the TC/EI plastic heat sink may incorporate one or more over molded copper or aluminum parts to further enhance heat transfer.

The heat sink 107 may be totally enclosed inside the electrical panel and no air flow is provided behind the electrical panel. The electrical panel can be installed directly onto a wall or can be installed inside the wall with a front flush to the wall. A conventional breaker and the solid-state circuit breaker can be mixed together in the electrical panel.

Figure 6:
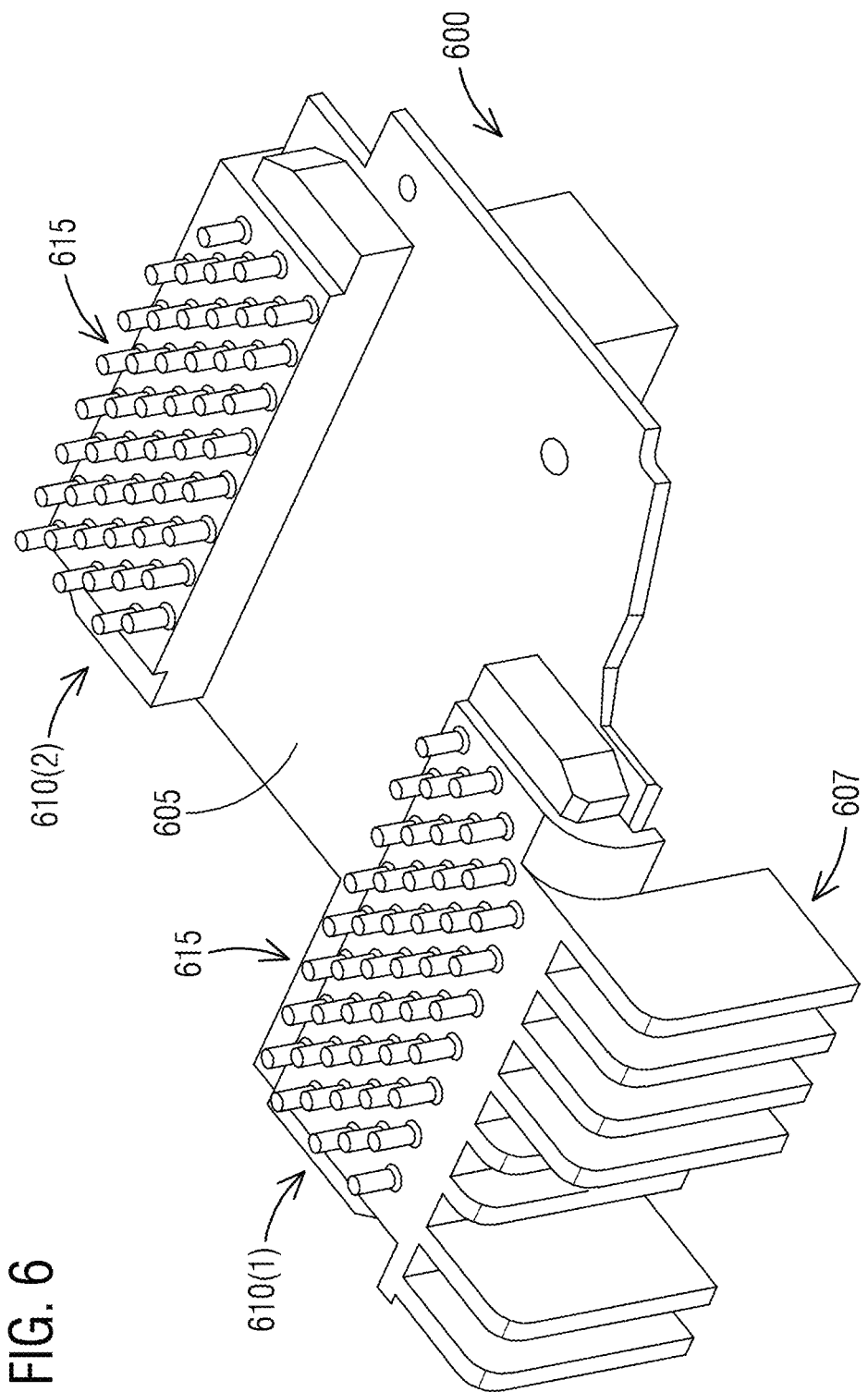
FIG. 6 illustrates a printed circuit board (PCB) assembly with field effect transistors (FETs) and over-molded plastic parts including an integral heat sink in accordance with an exemplary embodiment of the present invention.

As shown in FIG. 6, it illustrates a printed circuit board (PCB) assembly 600 with field effect transistors (FETs) and a plastic part with over-molded plastic parts 610(1-2) including an integral heat sink 607 in accordance with an exemplary embodiment of the present invention. A solid-state circuit breaker 605 further comprises a plurality of cylindrical posts 615 extending from the plastic part with the two over-molded plastic parts 610(1-2) to increase heat transfer by increasing a surface area since the plurality of cylindrical posts 615 allow for a 2-dimensional airflow inside the solid-state circuit breaker 605.

Figure 7:
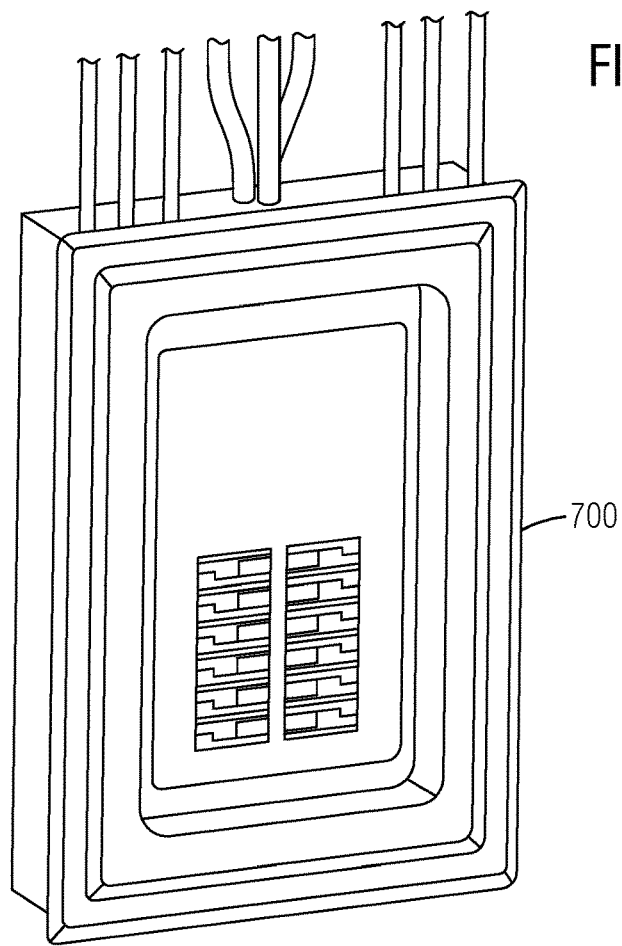
FIGS. 7-8 illustrate a solid-state circuit breaker installed in an existing electrical panel in accordance with an exemplary embodiment of the present invention.
Figure 8:
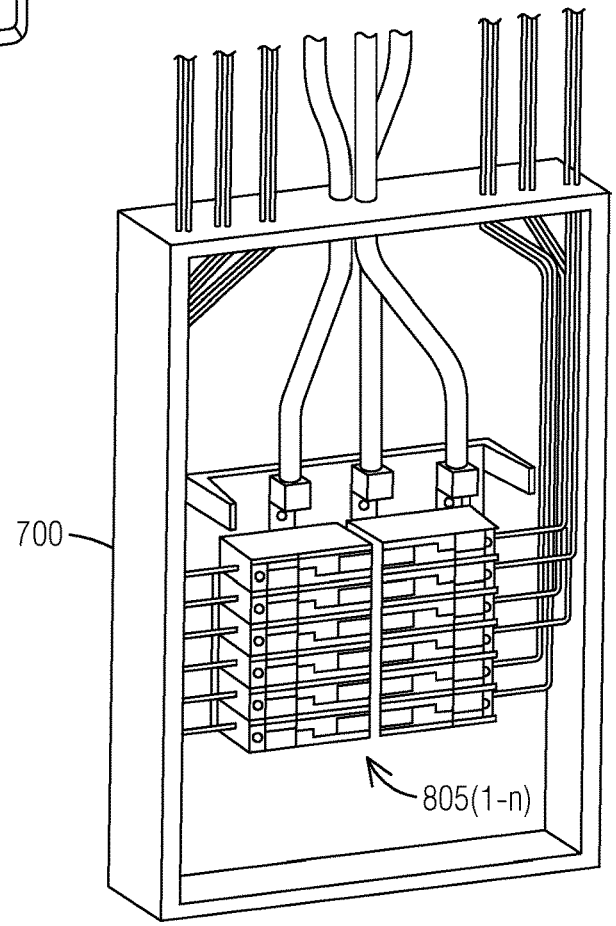

FIGS. 7-8 illustrate a solid-state circuit breaker installed in an existing electrical panel 700 in accordance with an exemplary embodiment of the present invention. The electrical panel 700 shown in FIG. 7 has wires shown similar to a UL test. In FIG. 7, the electrical panel 700 has been simplified (defeatured) for illustration purposes. For example, unused knockout holes have been deleted. The electrical panel 700 comprises an existing vertical air channel (shown in FIG. 9) formed in a space in front of a main bus of the electrical panel 700.

Figure 9:
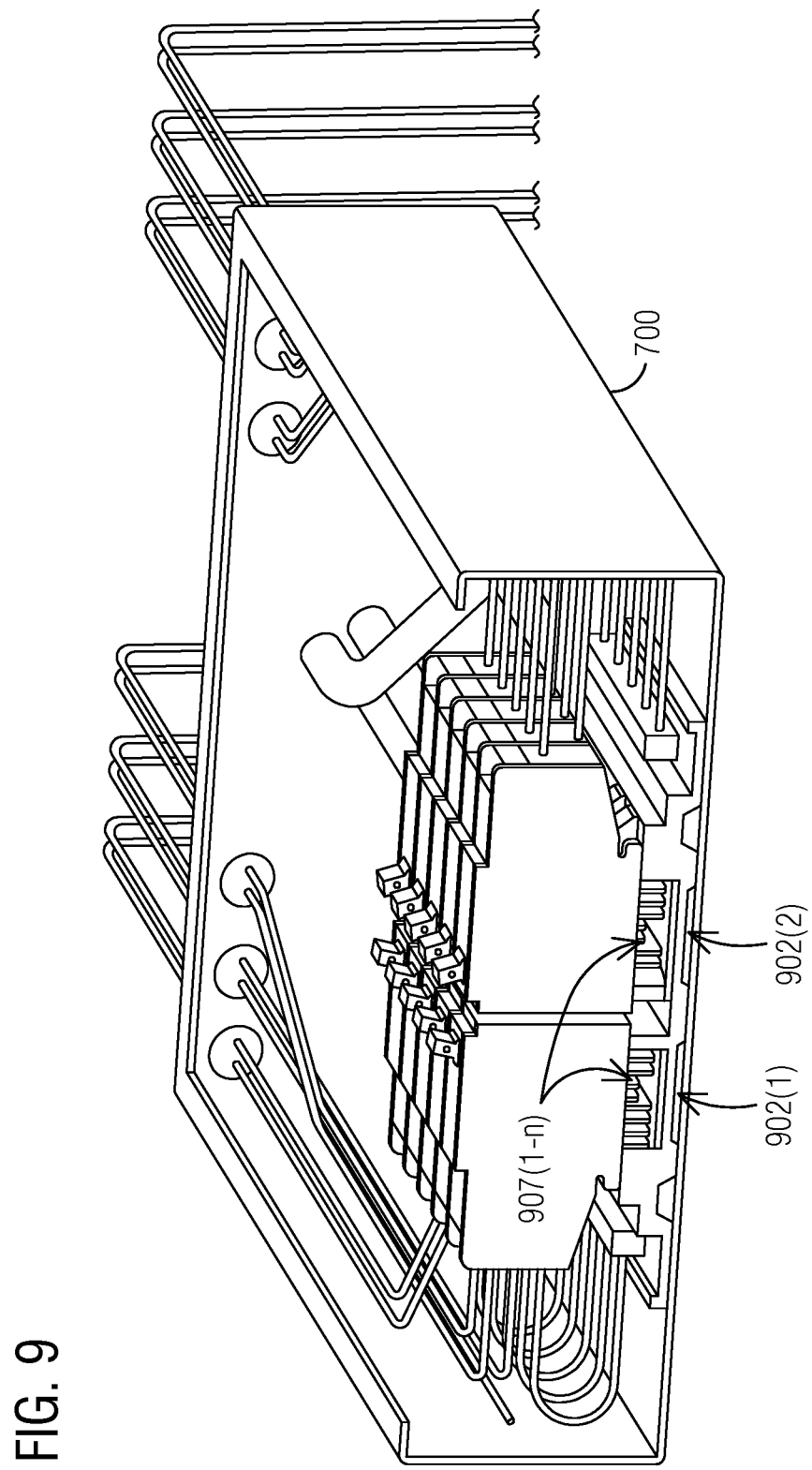
FIGS. 9-10 illustrate a location of an air channel and heat sinks extending into the air channel in accordance with an exemplary embodiment of the present invention.

With regard to FIG. 8, the electrical panel 700 further comprises a plurality of solid-state circuit breakers (SSCBs) 805(1-$n$) such that conventional breakers and SSCBs can be mixed together in the electrical panel 700. The electrical panel 700 further comprises a plurality of heat sinks (as seen in FIG. 9) such that each solid-state circuit breaker 805 has its own integral heat sink. Each heat sink interfaces with the existing vertical air channel inside the electrical panel 700 and the plurality of heat sinks are totally enclosed inside the electrical panel 700.

Figure 10:
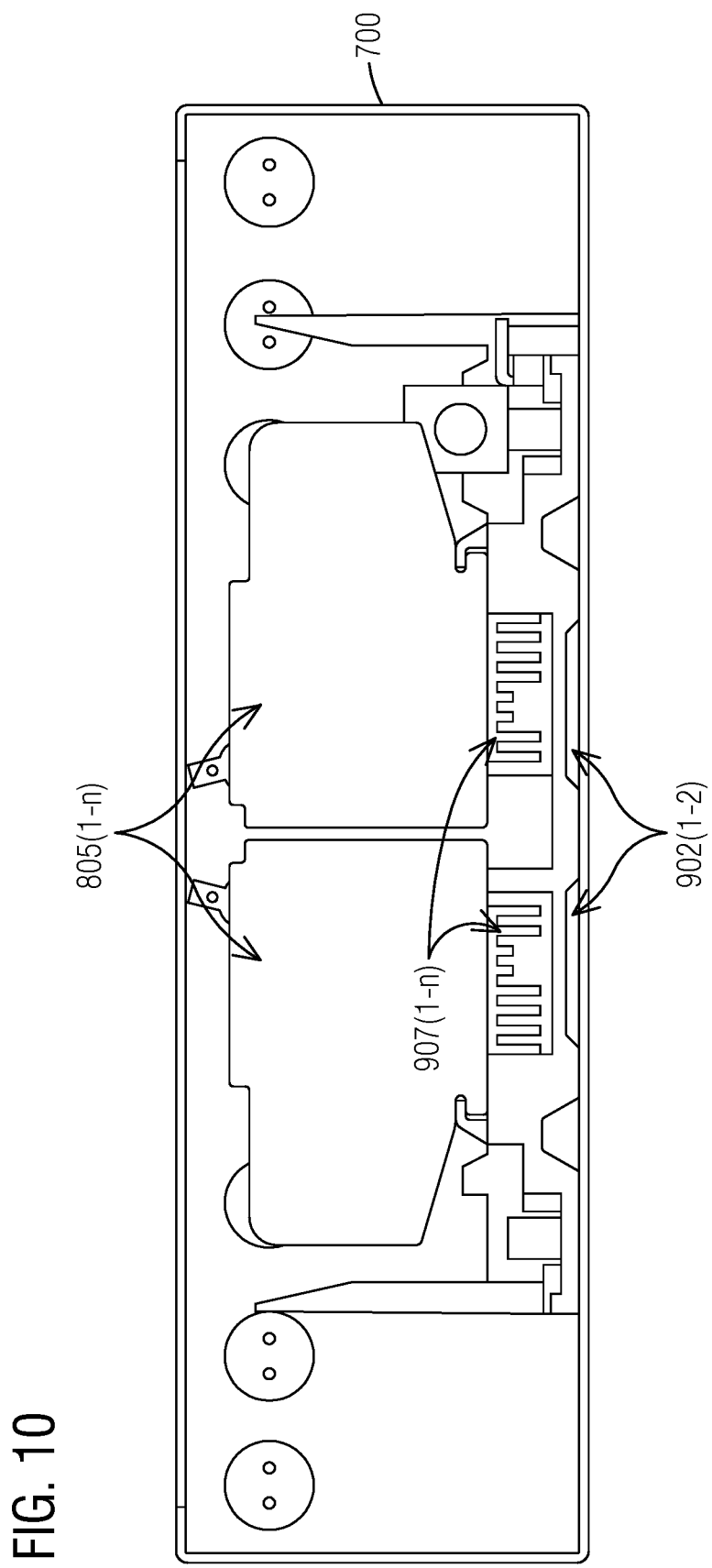

FIGS. 9-10 illustrate a location of two existing vertical air channels 902(1-2) and a plurality of heat sinks 907(1-$n$) extending into the existing vertical air channels 902(1-2) in accordance with an exemplary embodiment of the present invention. With respect to FIG. 9, it shows a cutaway view of the electrical panel 700 with the SSCBs 805(1-$n$) installed in it. The two existing vertical air channels 902(1-2) are located behind the SSCBs 805(1-$n$). The plurality of heat sinks 907(1-$n$) extend into these two existing vertical air channels 902(1-2). FIG. 10 shows another cutaway view of the electrical panel 700 with the SSCBs 805(1-$n$) installed in it.

One embodiment of the present invention provides the heat sink 107 that interfaces with and takes advantage of existing air currents inside the electrical panel 700. The space in front of a main bus of the electrical panel 700 provides an air volume in which air can enter, flow freely in a vertical direction, and exit at the top. This air volume comprises a rectangular-cross-section air channel 902 with open ends. Three sides of the rectangle are provided by a plastic base mount in the electrical panel 700 on which the main bus is mounted. The front side of the air channel 902 is enclosed by the row of circuit breakers mounted in the electrical panel 700. (These circuit breakers might be either SSCBs or conventional circuit breakers.) The features of the electrical panel 700 are common to a whole family of commercial panels. Ohmic losses in the main bus generate heat which is transferred by convection to the air in the air channel 902. The heated air becomes buoyant and rises. The rising air comprises an air current that flows upward through the electrical panel 700. The buoyant airflow effect is similar to a fireplace chimney, and we refer to this as a "chimney effect". The heat sink 107 is located at the back of the SSCB 105, and it extends into this air channel 902. Because convection heat transfer increases with air flow velocity, this positioning of the heat sink 107 provides advantageous heat transfer. The heat sink 107 adds heat to the airflow, thereby increasing flow velocity and improving the chimney effect.

Figure 11:
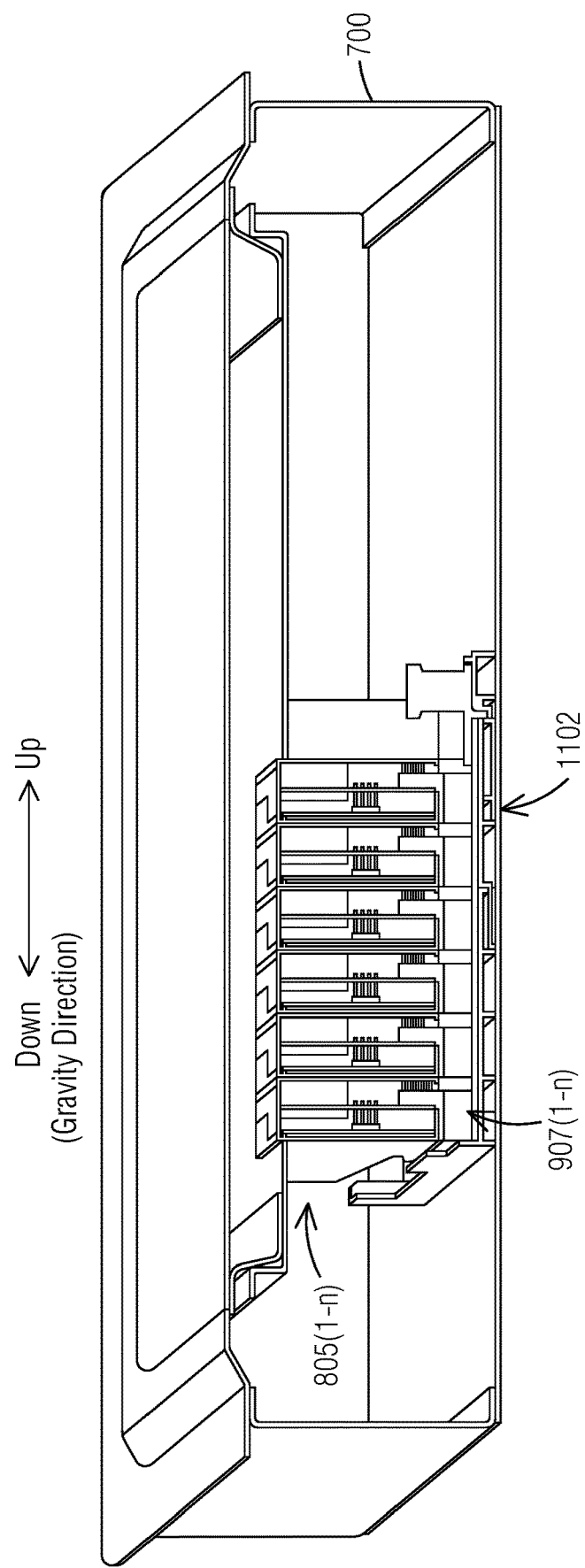
FIGS. 11-12 illustrate air currents arising from a chimney effect in accordance with an exemplary embodiment of the present invention.
Figure 12:
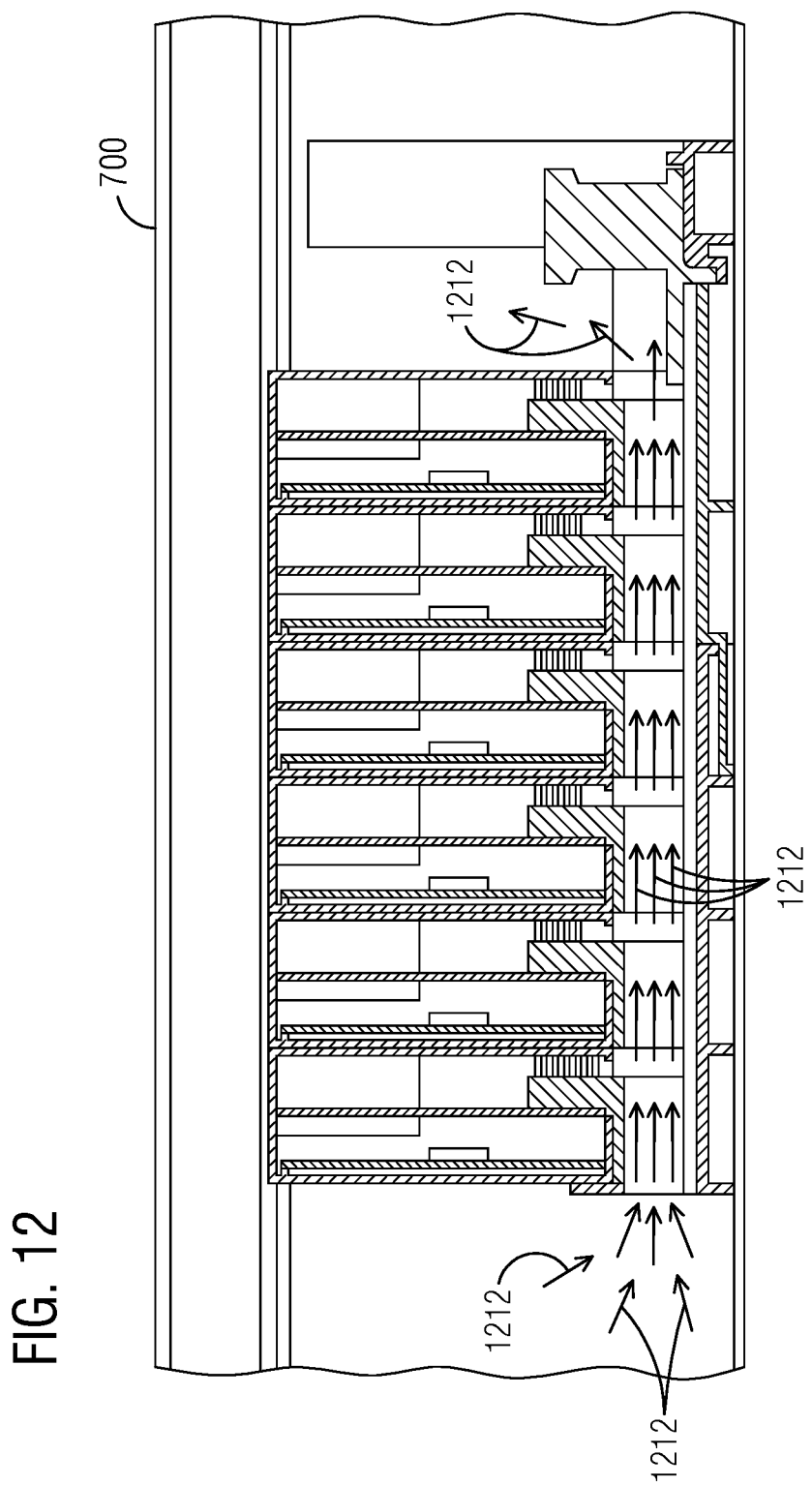

FIGS. 11-12 illustrate air currents arising from a chimney effect in accordance with an exemplary embodiment of the present invention. FIG. 11 shows a side cutaway view of the electrical panel 700 with the SSCBs 805(1-$n$) installed in it. For example, it shows an air channel 1102 on a left side. The air channel 1102 is located behind the SSCBs 805(1-$n$). The plurality of heat sinks 907(1-$n$) extend into these channels.

FIG. 12 shows another side cutaway view of the electrical panel 700 with the SSCBs 805(1-$n$) installed in it. Arrows 1212 indicate an airflow direction.

Figure 13:
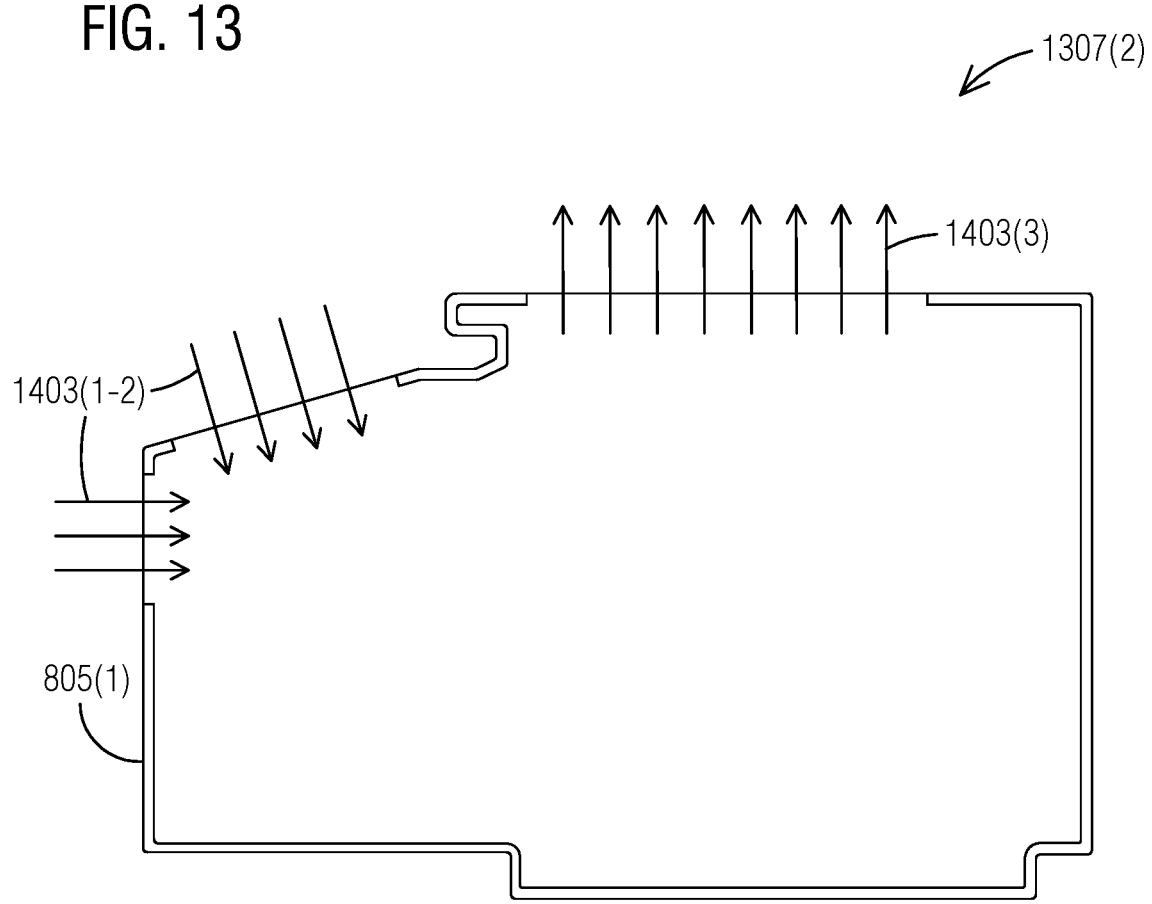
FIG. 13 illustrates a view of the thermal/flow of the same cutaway view as FIG. 12 in accordance with an exemplary embodiment of the present invention.

FIG. 13 illustrates another view of a thermal flow 1307(2) of FIG. 12 in accordance with an exemplary embodiment of the present invention. This is a section view of one 805(1) of the SSCBs 805(1-$n$). Simulation small arrows indicate air flow velocity. Arrows 1403(1-2) indicate air enters the SSCB 805(1) through these vents. An arrow 1403(3) indicates air exits the SSCB 805(1) into the air channel 1102. This is an illustration of the Bernoulli effect, in which air velocity in the air channel 1102 draws air through the SSCBs 805(1-$n$).

Figure 14:
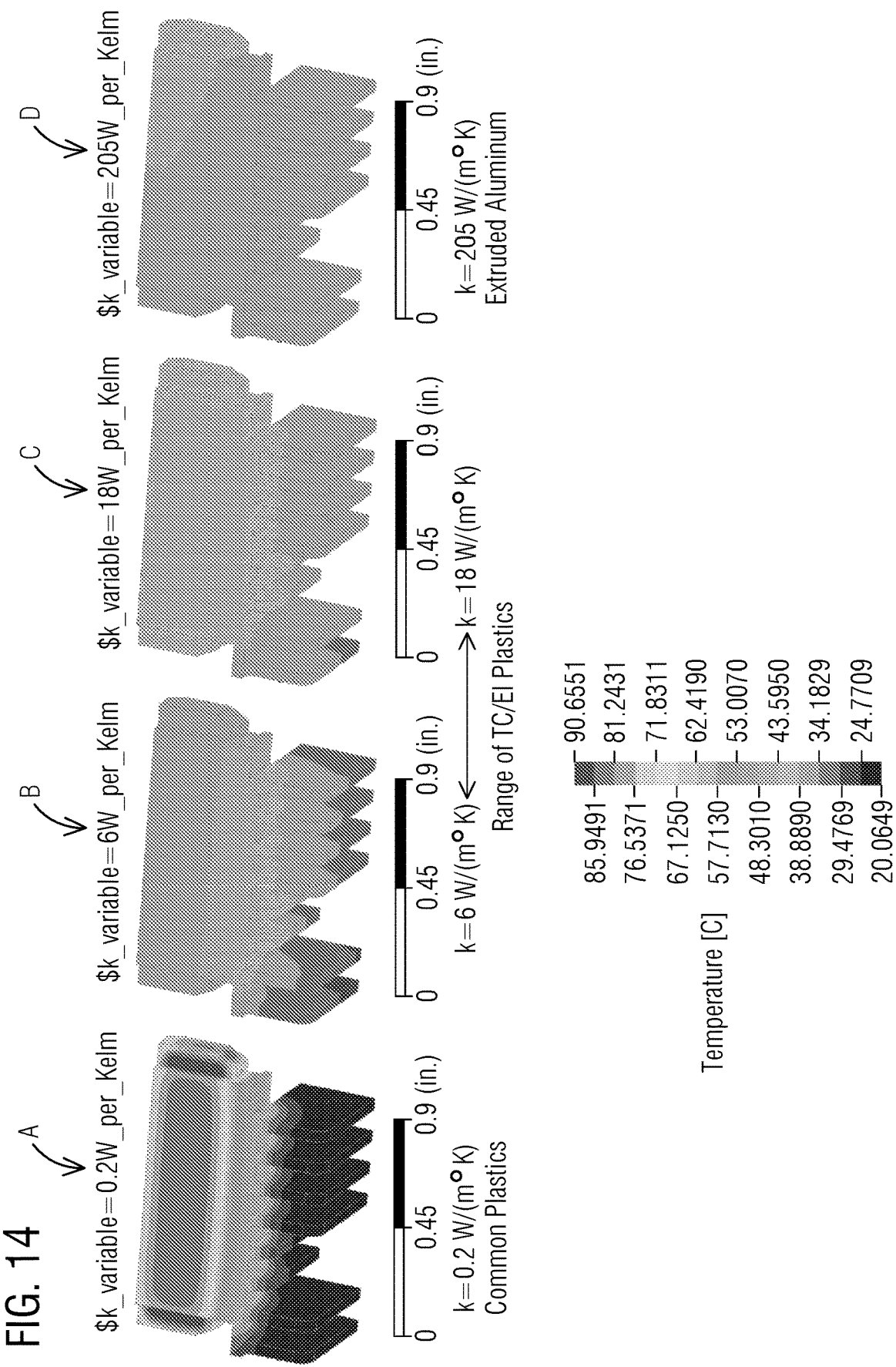
FIG. 14 illustrates plots of temperature distribution in the heat sink at various levels of thermal conductivity in accordance with an exemplary embodiment of the present invention.

FIG. 14 illustrates A-D simulation plots of temperature distribution in the heat sink 107 at various levels of thermal conductivity in accordance with an exemplary embodiment of the present invention. Conductivity values of TC/EI plastics give temperature distributions that look more like aluminum than like common plastics.

Figure 15:
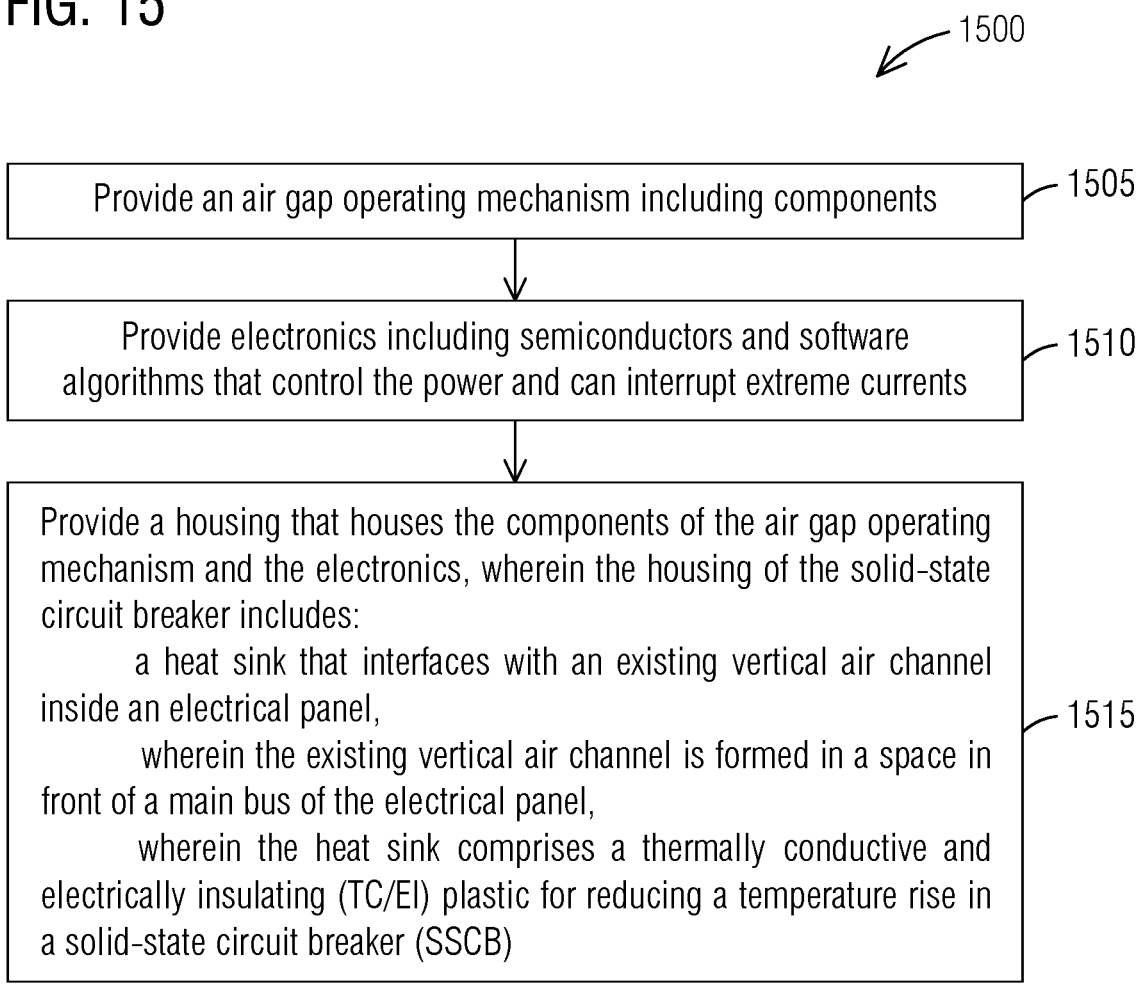
FIG. 15 illustrates a method of reducing a temperature rise in a solid-state circuit breaker (SSCB) in accordance with an exemplary embodiment of the present invention.

FIG. 15 illustrates a method 1500 of reducing a temperature rise in the solid-state circuit breaker (SSCB) 107 in accordance with an exemplary embodiment of the present invention. Reference is made to the elements and features described in FIGS. 1-14. It should be appreciated that some steps are not required to be performed in any particular order, and that some steps are optional.

The method 1500 comprises a step 1505 of providing an airgap operating mechanism including components. The method 1500 further comprises a step 1510 of providing electronics including semiconductors and software algorithms that control the power and can interrupt extreme currents. The method 1500 further comprises a step 1515 of providing a housing that houses the components of the airgap operating mechanism and the electronics. The housing of the solid-state circuit breaker includes the heat sink 107 that interfaces with an existing vertical air channel inside an electrical panel. The existing vertical air channel is formed in a space in front of a main bus of the electrical panel. The heat sink 107 comprises a thermally conductive and electrically insulating (TC/EI) plastic.

Conventional breakers generally do not have heat sinks 107 at the rear of the breaker 105, and do not require them. The advantages of SSCBs over conventional circuit breakers were described earlier.

Previous uses of over-molding and thermally-conductive plastics did not involve cooling of solid-state semiconductor components, and did not involve the heat sink 107 with fins on the exterior of the breaker 105. Typically, there is no room for such exterior fins because they increase the external envelope size of the breaker. However, in embodiments of the present invention, a space in the electrical panel behind the breaker 105 is being used that is otherwise empty. Therefore, heat sink fins have no disadvantage of requiring additional space.

Hybrid breakers seem to exist, but without many examples in production. In theory, hybrid breakers should not produce more heat than conventional breakers, and therefore might not require additional heat sinks. However, they are (hypothetically) more complex than either conventional breakers or SSCBs, because they must provide arcing contacts, means of extinguishing an arc (although with reduced arcing energy compared to conventional breakers), solid-state switching components, and a means of commutating the current from the main current path to the solid-state components. Hybrid breakers are inherently slower and provide less current limitation than SSCBs. They have less load endurance capability than SSCBs because of the arcing contacts.

On the other hand, some hybrid breakers may be compatible with existing enclosures. Some conventional breaker designs have been converted into hybrids.

Some concepts have the severe disadvantage that a customer must provide air flow behind the electrical panel 700. This is not a requirement for most existing panels for conventional breakers. Such panel cannot be installed directly onto a wall; neither can it be installed inside a wall with the front flush to the wall, like existing conventional panels. Therefore, this is concept disallows retrofitting of existing installations. The panel is not compatible with existing conventional circuit breakers or accessories. On the other hand, has the heat sink 107 is totally enclosed inside the electrical panel 700. Each SSCB has its own integral heat sink. This is unlike other designs, in which each breaker is equipped only with a baseplate as a heat transfer interface and must be attached to an external heat sink. The electrical panel 700 has no external heat sink. The electrical panel 700 can be installed in the conventional manner, in the same manner as with previous conventional breakers. Conventional breakers and SSCBs can be mixed together in the same panel 700. This allows the customer to use lower cost conventional circuit breakers on some of the circuits if the customer desires. Unlike other designs, present invention does not rely on external air flow behind the electrical panel 700. Rather, it utilizes an air channel internal to the electrical panel 700.

While a design of a solid-state circuit breaker is described here a range of one or more other circuit breakers are also contemplated by the present invention. For example, other circuit breakers may be implemented based on one or more features presented above without deviating from the spirit of the present invention.

The techniques described herein can be particularly useful for a thermally conductive, electrically insulating (TC/EI) plastic where the thermal conductivity (k) of a TC/EI plastic of the heat sink is between a range of 5 to 20 W/(m° K). While particular embodiments are described in terms of this range, the techniques described herein are not limited to such a range but can also be used with other ranges.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A solid-state circuit breaker (SSCB) comprising:
an airgap operating mechanism including components;
electronics including semiconductors and software algorithms that control power and can interrupt currents; and
a housing that houses the components of the airgap operating mechanism and the electronics, wherein the housing of the solid-state circuit breaker includes:
a heat sink that interfaces with a natural air flow inside an electrical panel, wherein the heat sink contains a thermally conductive and electrically insulating (TC/EI) plastic,
wherein the heat sink is located at a back of the solid-state circuit breaker and the heat sink extends into an existing vertical air channel, and
wherein the heat sink is part of an outer molded case such that a plastic part of the heat sink is over-molded onto a printed circuit board so that the plastic part covers the semiconductors of the solid-state circuit breaker, wherein the plastic part is to be separated into two or more parts if the semiconductors are located at different locations on the printed circuit board such that a thermal bridge to conduct heat between the two or more parts and eventually to a plurality of fins external to the solid-state circuit breaker.

2. The solid-state circuit breaker of claim 1, further comprising:
a plurality of cylindrical posts extending from the plastic part to increase heat transfer by increasing a surface area since the plurality of cylindrical posts allow for a 2-dimensional airflow inside the solid-state circuit breaker.

3. The solid-state circuit breaker of claim 1, wherein the heat sink includes the plurality of fins on an exterior of the solid-state circuit breaker and the plurality of fins extends into an existing vertical air channel, wherein the plurality of fins is disposed in a space in the electrical panel behind the solid-state circuit breaker that is otherwise empty.

4. The solid-state circuit breaker of claim 1, further comprising:
one or more ventilation openings in the solid-state circuit breaker such that one of the one or more ventilation openings is a "rear vent" that allows an air flow to exit the solid-state circuit breaker into an existing vertical air channel.

5. The solid-state circuit breaker of claim 1, wherein the heat sink is totally enclosed inside the electrical panel.

6. The solid-state circuit breaker of claim 1, wherein no air flow is provided behind the electrical panel.

7. The solid-state circuit breaker of claim 1, wherein the electrical panel can be installed directly onto a wall or can be installed inside the wall with a front flush to the wall.

8. The solid-state circuit breaker of claim 1, wherein a conventional breaker and the solid-state circuit breaker can be mixed together in the electrical panel.

9. An electrical panel, comprising:
an existing vertical air channel formed in a space in front of a main bus of the electrical panel;
a plurality of solid-state circuit breakers (SSCBs), wherein conventional breakers and the SSCBs can be mixed together in the electrical panel;
a plurality of heat sinks such that each of the solid-state circuit breakers has its own integral heat sink, wherein each of the heat sinks interfaces with the existing vertical air channel inside the electrical panel and the plurality of heat sinks are totally enclosed inside the electrical panel, wherein each of the solid-state circuit breakers comprising:
an airgap operating mechanism including components;
electronics including semiconductors and software algorithms that control power and can interrupt extreme currents; and
a housing that houses the components of the airgap operating mechanism and the electronics, wherein the housing of each of the solid-state circuit breakers includes:
a heat sink of the plurality of heat sinks, wherein the heat sink comprises a thermally conductive and electrically insulating (TC/EI) plastic,
wherein the heat sink is located at a back of each of the solid-state circuit breakers and the heat sink extends into the existing vertical air channel, and
wherein the heat sink is part of an outer molded case such that a plastic part of the heat sink is over-molded onto a printed circuit board so that the plastic part covers the semiconductors each of the solid-state circuit breakers, wherein the plastic part is to be separated into two or more parts if the semiconductors are located at different locations on the printed circuit board such that a thermal bridge to conduct heat between the two or more parts and eventually to a plurality of fins external to each of the solid-state circuit breakers.

10. The electrical panel of claim 9, further comprising:
a plurality of cylindrical posts extending from the plastic part to increase heat transfer by increasing a surface area since the plurality of cylindrical posts allow for a 2-dimensional airflow inside each of the solid-state circuit breakers.

11. The electrical panel of claim 9, wherein the heat sink includes the plurality of fins on an exterior of each of the solid-state circuit breakers and the plurality of fins extends into the existing vertical air channel, wherein the plurality of fins is disposed in a space in the electrical panel behind each of the solid-state circuit breakers that is otherwise empty.

12. The electrical panel of claim 9, wherein no air flow is provided behind the electrical panel, and wherein the electrical panel can be installed directly onto a wall or can be installed inside the wall with a front flush to the wall.

13. The electrical panel of claim 9, wherein each of the solid-state circuit breakers further comprising:
one or more ventilation openings such that one of the one or more ventilation openings is a "rear vent" that allows an air flow to exit each of the solid-state circuit breakers into the existing vertical air channel.

14. A method of reducing a temperature rise in a solid-state circuit breaker (SSCB), the method comprising:
providing an airgap operating mechanism including components;
providing electronics including semiconductors and software algorithms that control power and can interrupt extreme currents; and
providing a housing that houses the components of the airgap operating mechanism and the electronics, wherein the housing of the solid-state circuit breaker includes:
a heat sink that interfaces with an existing vertical air channel inside an electrical panel, wherein the existing vertical air channel is formed in a space in front of a main bus of the electrical panel,
wherein the heat sink comprises a thermally conductive and electrically insulating (TC/EI) plastic,
wherein the heat sink is located at a back of the solid-state circuit breaker and the heat sink extends into the existing vertical air channel, and
wherein the heat sink is part of an outer molded case such that a plastic part of the heat sink is over-molded onto a printed circuit board so that the plastic part covers the semiconductors of the solid-state circuit breaker, wherein the plastic part is to be separated into two or more parts if the semiconductors are located at different locations on the printed circuit board such that a thermal bridge to conduct heat between the two or more parts and eventually to a plurality of fins external to the solid-state circuit breaker.

* * * * *